United States Patent
Lobbins et al.

[11] Patent Number: 6,156,675
[45] Date of Patent: Dec. 5, 2000

[54] METHOD FOR ENHANCED DIELECTRIC FILM UNIFORMITY

[75] Inventors: Jonathon M. Lobbins; Leonard J. Olmer, both of Orlando, Fla.

[73] Assignee: Lucent Technologies, Inc., Murray Hill, N.J.

[21] Appl. No.: 09/407,575

[22] Filed: Sep. 28, 1999

[51] Int. Cl.$^7$ .............................. B05D 3/06; H01L 21/44
[52] U.S. Cl. .......................... 438/788; 438/765; 438/771
[58] Field of Search .................................... 438/765, 771, 438/788

[56] References Cited

U.S. PATENT DOCUMENTS

| | | | |
|---|---|---|---|
| 5,851,602 | 12/1998 | Law et al. ................................. | 427/579 |
| 5,895,259 | 4/1999 | Carter et al. ............................ | 438/563 |

*Primary Examiner*—Charles Bowers
*Assistant Examiner*—Lisa Kilday

*Attorney, Agent, or Firm*—Quarles & Brady LLP

[57] ABSTRACT

The present invention relates to an apparatus and method for depositing a film on a wafer. A reactor for depositing a film on a surface of a wafer comprises a processing chamber having an electrode, a ceramic wafer support supporting the wafer and separated from the electrode by a distance of between 230 and 240 millimeters, a gas inlet supplying gas reactants, and a radio frequency inlet supplying radio frequency energy. The reactor further comprises a heating chamber having at least one heat source which heats the wafer. A method for depositing a film on a surface of a semiconductor wafer comprises providing a processing chamber having a ceramic wafer support supporting the wafer and an electrode, separating the electrode from the ceramic wafer support by a distance of between 230 and 240 millimeters, supplying radio frequency energy into the processing chamber, supplying gas reactants into the processing chamber, and heating the wafer.

9 Claims, 4 Drawing Sheets

CERAMIC SUSCEPTOR - BORON % VS. SPACING

CERAMIC SUSCEPTOR – STRESS vs. SPACING

CERAMIC SUSCEPTOR – DEPRATE vs. SPACING

CERAMIC SUSCEPTOR – BORON % vs. SPACING

CERAMIC SUSCEPTOR - PHOS % vs. SPACING

METHOD FOR ENHANCED DIELECTRIC FILM UNIFORMITY

CROSS-REFERENCE TO RELATED APPLICATIONS (Not Applicable)

STATEMENT REGARDING FEDERALLY SPONSORED RESEARCH OR DEVELOPMENT (Not Applicable)

BACKGROUND OF THE INVENTION

1. Field of the Invention

This invention relates generally to plasma enhanced chemical vapor deposition (PECVD) reactors, and more particularly to a method and arrangement for depositing film on a semiconductor wafer in a PECVD reactor.

2. Description of the Related Art

Dielectric film deposition has been used extensively during the processing of semiconductor wafers. Several types of silicon-based plasma dielectric films are currently deposited on the surface of wafers during wafer fabrication, including silicon oxide, silicon nitride, silicon oxynitride, phosphorous-doped silicate glass (PSG), and boron/phosphorous-doped silicate glass (BPSG). Of these films, silicon dioxide ($SiO_2$) deposited by chemical vapor deposition (CVD) has been found to be particularly useful in wafer formation.

CVD is the formation of a nonvolatile solid film on a substrate by the reaction of vapor-phase chemicals (reactants). CVD is a material synthesis process in which constituents in the vapor-phase chemicals react chemically near or on a wafer surface to form a solid product. Several steps occur during CVD reactions. These steps include the transport of reacting gaseous species to the wafer surface, the absorption of the species on the wafer surface, a heterogenous surface reaction catalyzed by the wafer surface, the desorption of gaseous reaction products, and the transport of the reaction products away from the wafer surface. CVD is a favored deposition process in many respects, primarily because of its ability to provide highly uniform films on wafers. Uniformity is defined as the consistency in the thickness of films deposited on wafers.

Numerous CVD deposition methods are well known, including atmospheric-pressure CVD (APCVD), low-pressure CVD (LPCVD), and PECVD. Rather than relying solely on thermal energy to initiate and sustain chemical reactions, PECVD uses a radio frequency (rf) induced glow discharge to transfer energy into reactant gases. The plasma-inducing glow discharge is generated by the application of an rf field to a low pressure gas, thereby creating free electrons within the discharge region. The electrons gain sufficient energy from the electric field so that when the electrons collide with gas molecules, gas-phase dissociation and ionization of the reactant gases occurs.

Advantageously, the PECVD process can take place at lower temperatures than can APCVD and LPCVD processes. This ability to process wafers at lower temperatures is a major advantage of PECVD because it provides a method of depositing films on some wafers which do not have the thermal stability to accept film deposition by other methods. In addition, PECVD can enhance the deposition rate when compared to thermal reactions alone, and can produce films of unique composition and properties.

As noted above, it is important for a PECVD reactor to have the ability to form films on wafers that have consistent thickness. One technique for obtaining a particular film thickness involves placing a disposable sample in a PECVD reactor for a fixed period of time, and depositing a film according to a PECVD process. Subsequently, the thickness of the film across the surface of the sample is measured. These steps are repeated several times so that the deposition rate for the reactor can be determined. Afterwards, a film is deposited on a wafer for a period of time corresponding to the period of time expected to achieve the desired film thickness on the wafer based upon the previously determined deposition rate.

One of the main problems with forming wafer films using PECVD reactors is parameter control. It is generally difficult to identify the effects of a specific process parameter because the PECVD system is complex. For example, plasma rf power and frequency, and reactant flow rates, concentration, and temperature all interact with each other, making it difficult to optimize a PECVD process. There are three main factors to consider when optimizing a PECVD process. First, maintaining plasma stability is important. To maintain a stable plasma, the plasma should be confined between the electrodes in the PECVD reactor and kept away from the walls of the reactor chamber. Second, the plasma density should be optimized for the desired deposition rate and uniformity. This optimization can be accomplished by adjusting the rf power and pressure, and the reactant gas flow rates. Finally, wafer temperature and position in a plasma should be tightly controlled. Differences in film thickness and composition can occur depending on variations in temperature and wafer position.

PECVD reactors have a structure which supports the wafer during the PECVD process. This wafer support, commonly referred to as a susceptor or a chuck, can be composed of any suitable supporting material. Most frequently, however, the wafer support is composed of a metal such as aluminum. Aluminum wafer supports are composed of a plate and a ceramic webbing attached to a portion of the plate. During the PECVD process, the plate tends to warp and the ceramic webbing tends to detach from the plate. As a result, aluminum wafer supports routinely need to be replaced. Unfortunately, replacement of the aluminum wafer support is time-consuming, taking an average of six hours to complete.

Throughput can often be increased by installing a ceramic wafer support in a PECVD reactor, rather than an aluminum wafer support. A ceramic wafer support is commonly composed only of a plate, and therefore does not have a webbing which tends to detach from the plate during PECVD processing.

Additionally, a ceramic wafer support does not have a tendency to warp.

Consequently, ceramic wafer supports are often more cost-effective than aluminum wafer supports.

As noted above, however, altering a parameter of a PECVD process may impact the uniformity of the film deposited on the surfaces of wafers during the PECVD process. Accordingly, using a ceramic wafer support rather than an aluminum wafer support can reduce process uniformity, especially when the replacement occurs in a reactor which is configured for an aluminum wafer support. Numerous steps can be taken to counter any such reduction in process uniformity, including adjusting the position of the wafer within the reactor during the PECVD process.

SUMMARY OF THE INVENTION

The present invention relates to an apparatus and method for depositing a film on a wafer. A reactor for depositing a film on a surface of a semiconductor wafer, according to the invention, comprises a processing chamber having an electrode, a ceramic wafer support supporting a wafer and separated from the electrode by a distance of between approximately 230 and approximately 240 millimeters, a gas inlet for supplying gas reactants, and a radio frequency inlet for supplying radio frequency energy. The reactor further comprises at least one heat source which heats the wafer. Preferably, the heat source heats the wafer to a temperature of between approximately 100° C. and approximately 500° C.

The ceramic wafer support is preferably separated from the electrode by a distance of between approximately 234 and approximately 236 millimeters, and is optimally separated from the electrode by a distance of approximately 235 millimeters. The gas reactants are preferably selected from the group consisting of silicon-containing gas and oxygen-containing gas. The reactant gases can include oxygen, helium, and tetraethylorthosilicate (TEOS). Alternatively, the reactant gases can include oxygen, helium, TEOS, and triethylborate (TEB), or oxygen, helium, TEOS, and triethylphosphate (TEPO). Most preferably, the reactant gases include oxygen, helium, TEOS, TEB, TEPO, and ammonia.

According to the invention, a semiconductor wafer having a surface and a film on the surface is formed by placing the wafer into a processing chamber of a PECVD reactor having a ceramic wafer support supporting the wafer and an electrode, separating the electrode from the ceramic wafer support by a distance of between approximately 230 and approximately 240 millimeters, supplying radio frequency energy into the processing chamber, supplying gas reactants into the processing chamber, and heating the wafer.

A method for depositing a film on a surface of a semiconductor wafer, according to the invention, comprises the steps of providing a processing chamber having a ceramic wafer support supporting the wafer and an electrode, separating the electrode from the ceramic wafer support by a distance of between approximately 230 and approximately 240 millimeters, supplying radio frequency energy into the processing chamber, supplying gas reactants into the processing chamber, and heating the wafer.

BRIEF DESCRIPTION OF THE DRAWINGS

There are presently shown in the drawings embodiments which are presently preferred, it being understood, however, that the invention is not limited to the precise arrangements and instrumentalities shown, wherein.

DETAILED DESCRIPTION OF THE PREFERRED EMBODIMENTS

Figure 1:
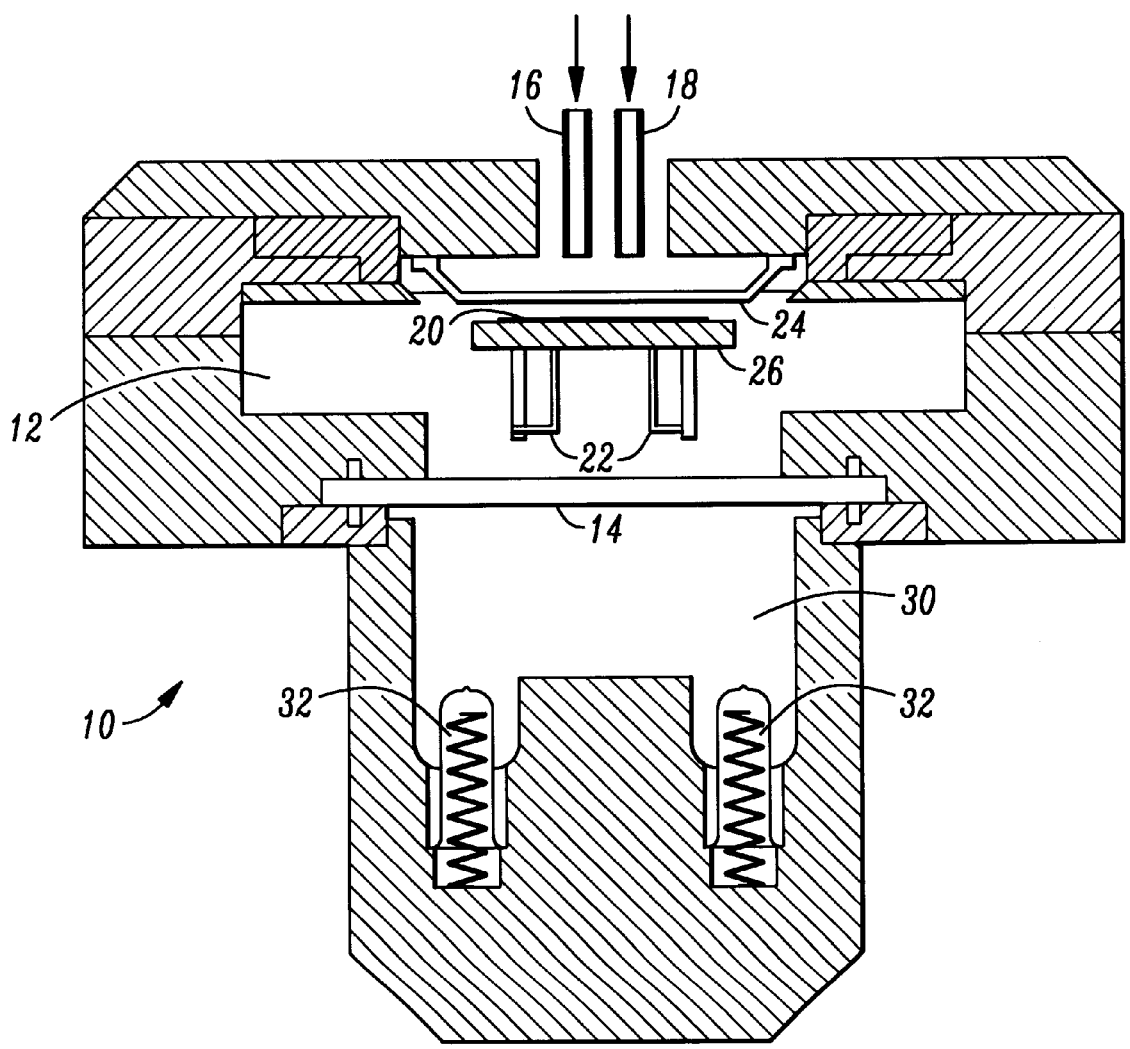
FIG. 1 is a cross-sectional view of a PECVD reactor according to the invention.

FIG. 1 shows a PECVD reactor 10 according to the present invention. The reactor 10 includes a processing chamber 12. In the processing chamber 12, a substrate such as a semiconductor wafer 20 is subjected to treatment with a plasma gas. The processing chamber 12 can operate at any pressure suitable for PECVD processing of the wafer 20. Preferably, however, PECVD processing occurs at a pressure of between 8 Torr and 16 Torr.

The processing chamber 12 includes a gas inlet 16 and an rf inlet 18. The plasma gas is generated by the combination of reactant gases which flow from at least one gas inlet 16 into the processing chamber 12, and energy which flows from at least one rf inlet 18 into the processing chamber 12. The rf energy may be any amount suitable for PECVD processing of the wafer 20. However, the rf energy is preferably between approximately 400 watts and approximately 800 watts, and is most preferably between approximately 500 watts and approximately 700 watts.

Each reactant gas preferably flows into the processing chamber 12 through a separate gas inlet 16. The reactant gases may be any gases suitable for forming a film on the surface of the wafer 20. Preferably, however, the reactant gases include an oxygen-containing reactant (e.g., oxygen) and a silicon-containing reactant (e.g., silane). For example, the reactant gases can include oxygen, helium, and tetraethylorthosilicate (TEOS). Alternatively, the reactant gases can include oxygen, helium, TEOS, and triethylborate (TEB), or oxygen, helium, TEOS, and triethylphosphate (TEPO). Most preferably, the reactant gases include oxygen, helium, TEOS, TEB, TEPO, and ammonia.

The processing chamber 12 also has a first electrode 24. The rf energy which helps generate the plasma is applied to the first electrode 24, creating an electric field. As energy from the rf electric field couples with the reactant gases, free electrons develop. The free electrons gain energy from the rf electric field. When these electrons collide with reactant gas molecules, gas-phase dissociation and ionization of the reactant gases occurs. The reactant gases are then adsorbed onto the surface of the wafer 20. Upon being adsorbed on the wafer 20, the reactant gases are subjected to ion and electron bombardment. Subsequently, the reactant gases react with other adsorbed species on the wafer 20 to form new bonds, creating a film on the wafer 20.

The wafer 20 is supported by a wafer support 26, which can be mounted onto a wall of the processing chamber 12. The wafer support 26 can be composed at least partially of ceramic, and is preferably entirely ceramic. The wafer support 26 acts as a second electrode, and is preferably grounded so that there is a potential difference between the first electrode 24 and the wafer support 26. It is also possible to ground the first electrode 24, as opposed to the wafer support 26.

The processing chamber 12 can also include a plurality of wafer lift fingers 22 which raise and lower the wafer 20 relative to the wafer support 26. The wafer 20 can be mounted on the wafer support 26 by a suitable mounting apparatus (not shown) such as a mechanical or electrostatic clamp. In the case of an electrostatic clamp, the electrostatic clamp can include water cooling channels for wafer temperature control.

The reactor 10 also has a heating chamber 30 having one or more heating sources 32. The heating sources 32 provide heat to the processing chamber 10 and heat the wafer support 26. Heating the wafer support 26 increases the temperature of the wafer 20, preferably to a temperature ranging from approximately 100° C. to approximately 500° C. Although FIG. 1 shows two heating sources 32, any number of heating sources 32 is acceptable. The heat can be diffused throughout the processing chamber 10 by a window 14. The window 14 can be formed from any substance suitable for diffusing heat generated by the heating sources 32. Preferably, however, the window is composed of quartz.

Films formed on the surface of wafers are considered uniform when they have consistent thickness. In a PECVD reactor 10, the distance between the first electrode 24 and the wafer support 26 can effect film uniformity. For example, where a PECVD reactor has a wafer support 26 formed from aluminum, film uniformity has been known to improve when the distance between the first electrode 24 and the aluminum wafer support 26 approaches 220 mm.

Prior to the present invention, however, high film uniformity could not be achieved when ceramic wafer supports 26 were installed in a PECVD reactor 10. Modifying the reactor 10 according to the invention resulted in surprisingly high film uniformity. Specifically, film uniformity consistently improved by 20 percent, and often improved by 23 percent or more. Improvements in film uniformity can be measured with any suitable device, such as a Thermawave Optiprobe. Such a device determines film thickness variation across the surface of the wafer 20 by measuring and comparing film thickness at individual sites on the wafer 20.

Figure 2:
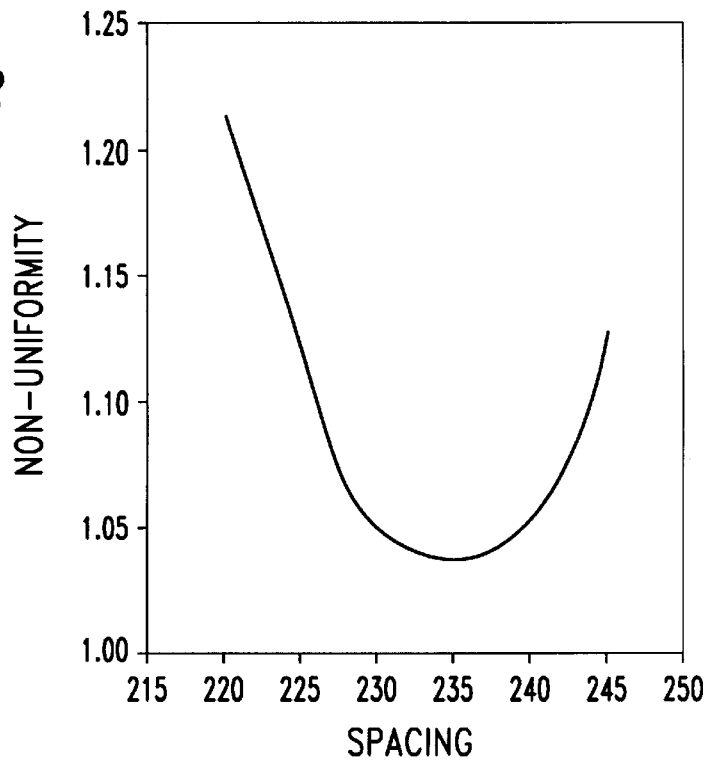
FIG. 2 is a graph showing uniformity in the formation of films on wafers as spacing between a PECVD reactor electrode and a ceramic wafer support is varied.

FIG. 2 shows the preferred spacing between the first electrode 24 and the ceramic wafer support 26. In FIG. 2, complete film uniformity is represented by 1.00. According to the invention, the uniformity improves significantly when the distance between the first electrode 24 and the ceramic wafer support 26 approaches the range of approximately 230 mm to approximately 240 mm. The distance is preferably between approximately 234 mm to approximately 236 mm, however, and is optimally approximately 235 mm.

In some cases, it may be desirable to modify an existing reactor 10 which has a first electrode 24 and an aluminum wafer support 26 separated by 220 mm. The modification can be the replacement of a wafer support 26 composed of aluminum with a wafer support 26 composed of ceramic. After such a modification, film uniformity can significantly decrease if the reactor 10 is not reconfigured. According to the invention, the spacing between the first electrode 24 and the ceramic wafer support 26 should be changed from 220 mm to approximately 235 mm, in order to improve film uniformity.

As stated above, however, changing one parameter of the PECVD process can adversely impact other process parameters. If the spacing change improves film uniformity but adversely effects other process parameters, the change has little value. Advantageously, this improved 235 mm spacing does not have a significant adverse effect on other PECVD process parameters, including the stress of the film deposited on the wafer, the rate at which film is deposited on the wafer, and the dopant concentration level of the film which is deposited on the wafer.

Figure 3:
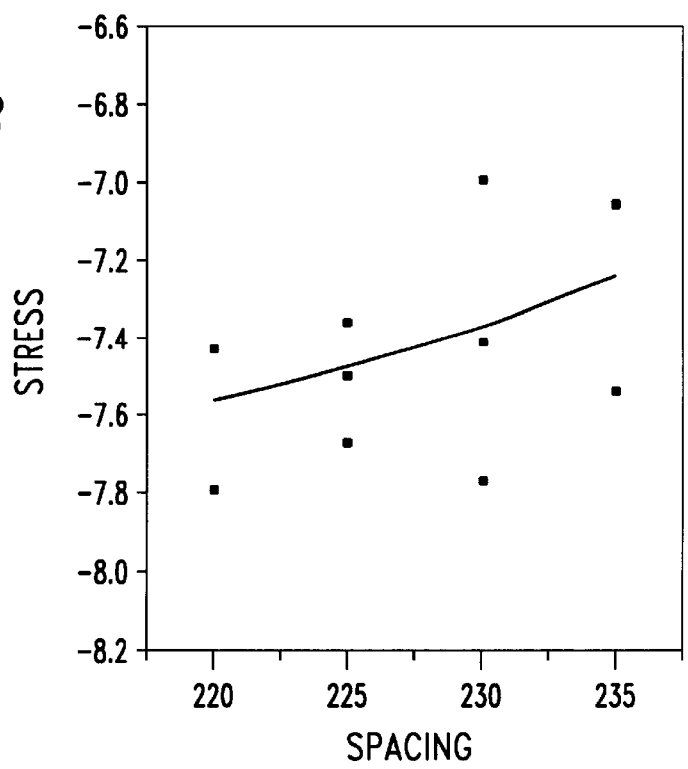
FIG. 3 is a graph showing stress in a wafer film as spacing between a PECVD reactor electrode and a ceramic wafer support is varied.
Figure 4:
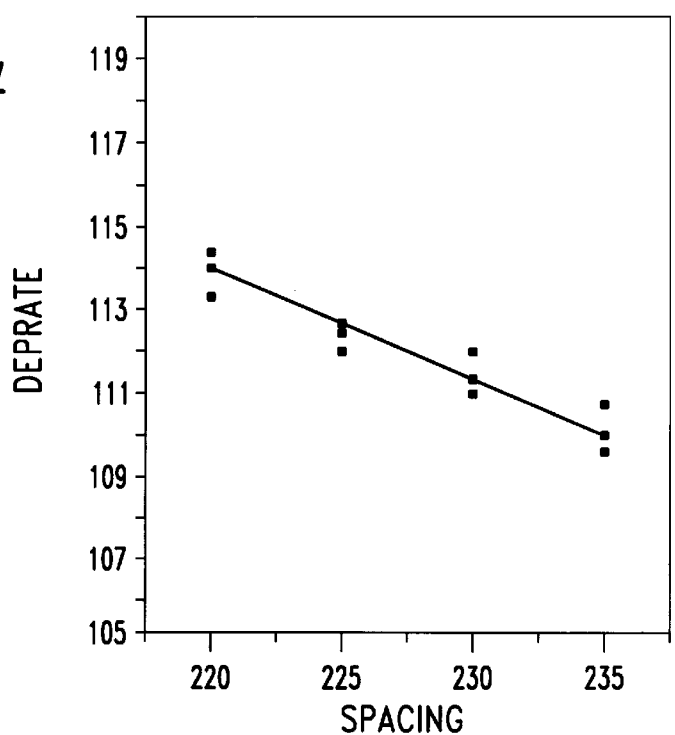
FIG. 4 is a graph showing the film deposition rate on a wafer as spacing between a PECVD reactor electrode and a ceramic wafer support is varied.

The film stress is the amount of stress which the film can withstand. FIG. 3 shows that the improved spacing between the first electrode 24 and the ceramic wafer support 26 does not have a significant negative impact on the stress of the film deposited on wafers 20 processed according to the invention. As shown in FIG. 4, the deposition rate for wafers 20 formed in the reactor 10 decreases approximately four percent as the spacing is changed from 220 m to 235 mm. The deposition rate was measured by monitoring the length of time required to form a film of a particular thickness on the surface of wafers 20. This slight decrease does not significantly effect the quality of the films formed on the wafer 20.

Figure 5:
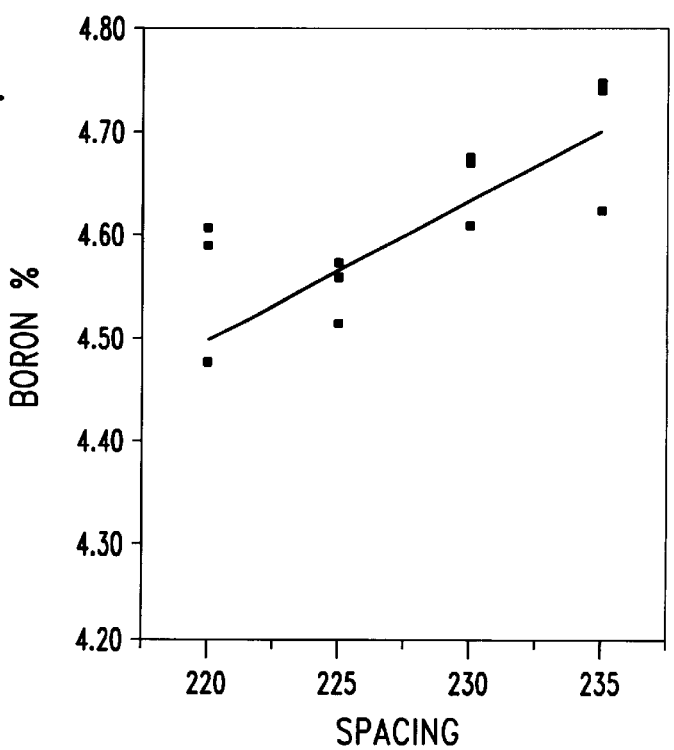
FIG. 5 is a graph showing the percentage of boron in BPSG films deposited on a wafer as the spacing between a PECVD reactor electrode and a ceramic wafer support is varied.

As previously discussed, BPSG films on sometimes deposited on the surface of wafers 20. The percentage of boron in such films is preferably between 4 percent and 5 percent. FIG. 5 indicates that when BPSG film is deposited on wafers 20 in the reactor 10, the percentage of boron in the BPSG film is not significantly altered as the spacing between the PECVD reactor electrode 24 and the ceramic wafer support 26 is adjusted from approximately 220 mm to approximately 235 mm, primarily because the boron percentage remains between 4 percent and 5 percent.

Figure 6:
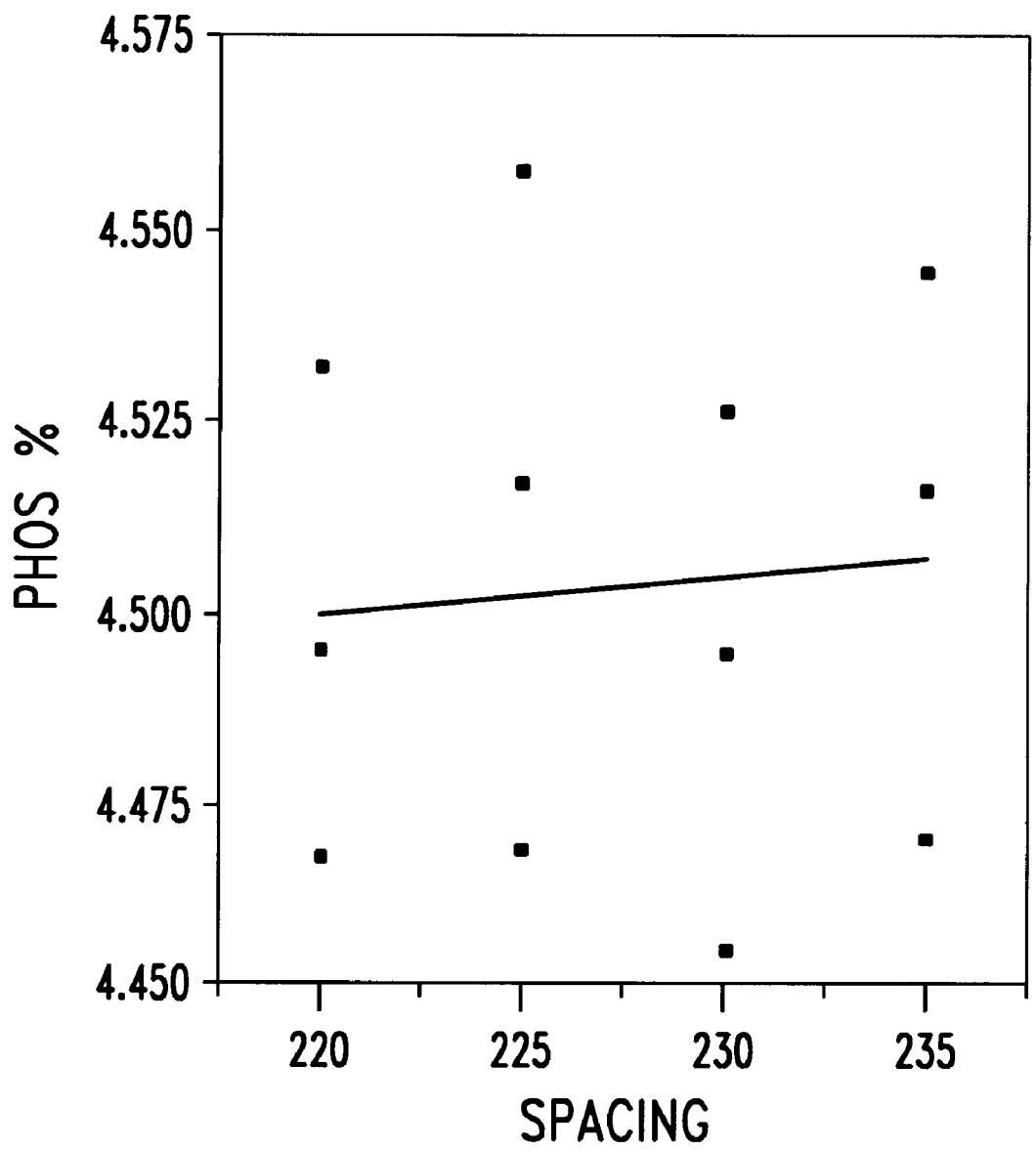
FIG. 6 is a graph showing the percentage of phosphorous in PSG films deposited on a wafer as the spacing between a PECVD reactor electrode and a ceramic wafer support is varied.

Similarly, when PSG films on deposited on the surface of wafers 20, the percentage of phosphorous in the film is preferably between 4 percent and five percent. FIG. 6 shows that the percentage of phosphorous in PSG film deposited on the surface of wafers 20 is not significantly effected as the spacing between a PECVD reactor electrode 24 and the ceramic wafer support 26 is varied from approximately 220 mm to approximately 235 mm, primarily because phosphorous percentage remains between 4 and 5 percent. The boron and phosphorous concentrations reflected in FIGS. 5–6 were measured using a Rigaku XRF device.

EXAMPLE

Wafers were processed in an Applied Materials P-5000 PECVD PLIS platform with a Universal SACVD BPTEOS DxP reactor. The processing chamber of this PECVD reactor was set to a pressure of 8 Torr. In the processing chamber, an electrode was first separated from a ceramic wafer support by a distance of approximately 220 mm. The wafers were supported by the ceramic wafer support during processing. Several reactant gases were simultaneously fed into the processing chamber. Specifically, each minute, 1400 parts/cm$^3$ of oxygen, 800 parts/cm$^3$ of helium, 600 parts/cm$^3$ of TEOS, 115 parts/cm$^3$ of TEB, 48 parts/cm$^3$ of TEPO, and 15 parts/cm$^3$ of ammonia entered the processing chamber. Additionally, 700 watts of rf energy flowed into the processing chamber. Heat sources in the heating chamber heated the ceramic wafer support to 480.0° C., and the wafer to approximately 480.0° C. The electrode was then separated from the ceramic wafer support by 235 mm. Using a Thermawave Optiprobe, film thickness uniformities were measured for the wafers which were formed while the electrode and ceramic wafer support was separated by 220 mm and 235 mm. Comparison of these measurements indicated that wafers formed with 235 mm spacing had a thickness uniformity which was approximately 23 percent greater than those formed with 220 mm spacing.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

What is claimed is:

1. A method for depositing a film on a surface of a semiconductor wafer, comprising the steps of:

providing a processing chamber having a ceramic wafer support supporting the wafer and an electrode;

separating the electrode from the ceramic wafer support by a distance of between approximately 230 and approximately 240 millimeters;

supplying radio frequency energy into the processing chamber;

supplying gas reactants into the processing chamber; and heating the wafer.

2. The method according to claim 1 further comprising the step of separating said ceramic wafer support from said electrode by a distance of between approximately 234 and approximately 236 millimeters.

3. The method according to claim 1 further comprising the step of separating said ceramic wafer support from said electrode by a distance of approximately 235 millimeters.

4. The method according to claim 1 further comprising the step of supplying gas reactants selected from the group consisting of silicon-containing gas and oxygen-containing gas.

5. The method according to claim 1 further comprising the step of supplying gas reactants into the processing chamber, wherein said reactants comprise oxygen, helium, and tetraethylorthosilicate.

6. The method according to claim 1 further comprising the step of supplying gas reactants into the processing chamber, wherein said reactants further comprise triethylphosphate.

7. The method according to claim 1 further comprising the step of supplying gas reactants into the processing chamber, wherein said reactants further comprise triethylborate.

8. The method according to claim 1 further comprising the step of supplying gas reactants into the processing chamber, wherein said reactants further comprise triethylphosphate, triethylborate, and ammonia.

9. The method according to claim 1 further comprising the step of heating the wafer to a temperature of between approximately 100 and approximately 500 degrees Celsius.

* * * * *